United States Patent
Choi

(10) Patent No.: US 9,508,683 B1
(45) Date of Patent: Nov. 29, 2016

(54) SEMICONDUCTOR PACKAGES AND METHODS FOR MANUFACTURING THE SAME

(71) Applicant: SK hynix Inc., Icheon-si, Gyeonggi-do (KR)

(72) Inventor: Hyung Ju Choi, Seoul (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 15/083,432

(22) Filed: Mar. 29, 2016

(30) Foreign Application Priority Data

Dec. 30, 2015 (KR) .................. 10-2015-0189866

(51) Int. Cl.
| | |
|---|---|
| H01L 23/552 | (2006.01) |
| H01L 25/065 | (2006.01) |
| H01L 23/04 | (2006.01) |
| H01L 23/00 | (2006.01) |
| H01L 23/31 | (2006.01) |
| H01L 23/498 | (2006.01) |

(52) U.S. Cl.
CPC ........... *H01L 25/065* (2013.01); *H01L 23/041* (2013.01); *H01L 23/3178* (2013.01); *H01L 23/49827* (2013.01); *H01L 23/552* (2013.01); *H01L 24/48* (2013.01); *H01L 2225/0651* (2013.01); *H01L 2225/06544* (2013.01); *H01L 2225/06548* (2013.01); *H01L 2225/06582* (2013.01)

(58) Field of Classification Search
CPC .... H01L 25/065; H01L 23/041; H01L 24/48
USPC ......................................................... 257/659
See application file for complete search history.

(56) References Cited

U.S. PATENT DOCUMENTS

| | | | |
|---|---|---|---|
| 2015/0129874 A1* | 5/2015 | Choi | H01L 23/552 257/48 |
| 2016/0204073 A1* | 7/2016 | Beak | H04W 4/001 455/418 |

FOREIGN PATENT DOCUMENTS

| | | |
|---|---|---|
| KR | 1020060098431 A | 9/2006 |
| KR | 1020110020548 A | 3/2011 |

* cited by examiner

*Primary Examiner* — David S Blum
(74) *Attorney, Agent, or Firm* — William Park & Associates Ltd.

(57) ABSTRACT

A semiconductor package and a method for manufacturing the same are provided. The semiconductor package may include a package substrate and at least one chip disposed on a first surface of the package substrate. The semiconductor package may include a boundary wall attached to the package substrate to surround the chip. The semiconductor package may include at least one bonding wire coupling the boundary wall to the package substrate. The semiconductor package may include a conductive roof covering a top surface of the boundary wall and extended to cover the first surface of the package substrate and the at least one chip.

20 Claims, 14 Drawing Sheets

SEMICONDUCTOR PACKAGES AND METHODS FOR MANUFACTURING THE SAME

CROSS-REFERENCE TO RELATED APPLICATION

The present application claims priority under 35 U.S.C. 119(a) to Korean Patent Application No. 10-2015-0189866, filed on Dec. 30, 2015, which is herein incorporated by reference in its entirety.

BACKGROUND

1. Technical Field

Various embodiments of the present disclosure generally relate to a packaging technology and, more particularly, to semiconductor packages including a shielding part and method for manufacturing the same.

2. Related Art

Semiconductor chip or die including integrated circuits may need to be protected from electromagnetic generating elements that could affect the operation of the integrated circuits. Electro-Magnetic Interference (EMI) is a factor which may cause a serious problem in most electronic devices or electronic systems. EMI disturbance can serve as a factor to degrade the effective operation of the circuit of the electronic device or the electronic system. In mobile devices or wearable devices used in close proximity to the human body, it is important to block the EMI from influencing the human body. Accordingly, in order to prevent the influence of the EMI on the human body or in order to ensure stable and effective operation of the electronic device, various methods to protect the devices from EMI has been tried.

SUMMARY

According to an embodiment, a semiconductor package may be provided. The semiconductor package may include a package substrate, at least one chip disposed on the package substrate. The semiconductor package may include a boundary wall including a wall body attached on the package substrate to surround the chip, a conductive via portion substantially vertically penetrating the wall body, and a conductive trace located on the wall body and connected to the conductive via. The semiconductor package may include a bonding wire contacting the conductive trace and grounding the conductive via to the package substrate. The semiconductor package may include a dielectric layer filling inner space surrounded by the boundary wall and covering the chip, and exposing the conductive trace. The semiconductor package may include a conductive roof covering the conductive trace and extending to cover a surface of the dielectric layer.

According to an embodiment, a semiconductor package may be provided. The semiconductor package may include a package substrate, at least one chip disposed on the package substrate. The semiconductor package may include a boundary wall including a wall body attached to surround the chip on the package substrate, a conductive via portion substantially vertically penetrating the wall body, and a conductive trace disposed on a top surface of the wall body and connected to the conductive via. The semiconductor package may include a conductive connecting portion electrically and mechanically connecting the conductive via to the package substrate. The semiconductor package may include a dielectric layer filling inner space surrounded by the boundary wall, and covering the chip and exposing the conductive trace. The semiconductor package may include a conductive roof extending to cover the conductive trace and to cover a surface of the dielectric layer.

According to an embodiment, a method for manufacturing a semiconductor package may be provided. The method may include disposing at least one chip on a package substrate. The method may include disposing a boundary wall on the package substrate, the boundary wall may include a wall body surrounding the chip, a conductive via portion substantially vertically penetrating the wall body, and a conductive trace disposed on a top surface of the wall body and connected to the conductive via. The method may include forming a dielectric layer covering the chip and filling an inner space surrounded by the boundary wall to expose the conductive trace. The method may include forming a conductive roof extending to cover the conductive trace and a surface of the dielectric layer.

According to an embodiment, there may be provided a memory card including a semiconductor package. The semiconductor package may include a package substrate, and at least one chip disposed on the package substrate. The semiconductor package may include a boundary wall including a wall body attached on the package substrate to surround the chip, a conductive via portion substantially vertically penetrating the wall body, and a conductive trace located on the wall body and connected to the conductive via. The semiconductor package may include a bonding wire contacting the conductive trace and grounding the conductive via to the package substrate. The semiconductor package may include a dielectric layer filling inner space surrounded by the boundary wall and covering the chip, and exposing the conductive trace. The semiconductor package may include a conductive roof covering the conductive trace and extending to cover a surface of the dielectric layer.

According to an embodiment, there may be provided a memory card including a semiconductor package. The semiconductor package may include a package substrate, and at least one chip disposed on the package substrate. The semiconductor package may include a boundary wall including a wall body attached to surround the chip on the package substrate, a conductive via portion substantially vertically penetrating the wall body, and a conductive trace disposed on a top surface of the wall body and connected to the conductive via. The semiconductor package may include a conductive connecting portion electrically and mechanically connecting the conductive via to the package substrate. The semiconductor package may include a dielectric layer filling inner space surrounded by the boundary wall, and covering the chip and exposing the conductive trace. The semiconductor package may include a conductive roof extending to cover the conductive trace and to cover a surface of the dielectric layer.

According to an embodiment, there may be provided an electronic system including a semiconductor package. The semiconductor package may include a package substrate, and at least one chip disposed on the package substrate. The semiconductor package may include a boundary wall including a wall body attached on the package substrate to surround the chip, a conductive via portion substantially vertically penetrating the wall body, and a conductive trace located on the wall body and connected to the conductive via. The semiconductor package may include a bonding wire contacting the conductive trace and grounding the conductive via to the package substrate. The semiconductor package may include a dielectric layer filling inner space surrounded by the boundary wall and covering the chip, and exposing the conductive trace. The semiconductor package may include a conductive roof covering the conductive trace and extending to cover a surface of the dielectric layer.

According to an embodiment, there may be provided an electronic system including a semiconductor package. The semiconductor package may include a package substrate, and at least one chip disposed on the package substrate. The semiconductor package may include a boundary wall including a wall body attached to surround the chip on the package substrate, a conductive via portion substantially vertically penetrating the wall body, and a conductive trace disposed on a top surface of the wall body and connected to the conductive via. The semiconductor package may include a conductive connecting portion electrically and mechanically connecting the conductive via to the package substrate. The semiconductor package may include a dielectric layer filling inner space surrounded by the boundary wall, and covering the chip and exposing the conductive trace. The semiconductor package may include a conductive roof extending to cover the conductive trace and to cover a surface of the dielectric layer.

According to an embodiment, a semiconductor package may be provided. The semiconductor package may include a package substrate and at least one chip disposed on a first surface of the package substrate. The semiconductor package may include a boundary wall attached to the package substrate to surround the chip. The semiconductor package may include at least one bonding wire coupling the boundary wall to the package substrate. The semiconductor package may include a conductive roof covering a top surface of the boundary wall and extended to cover the first surface of the package substrate and the at least one chip.

DETAILED DESCRIPTION

Figure 1:
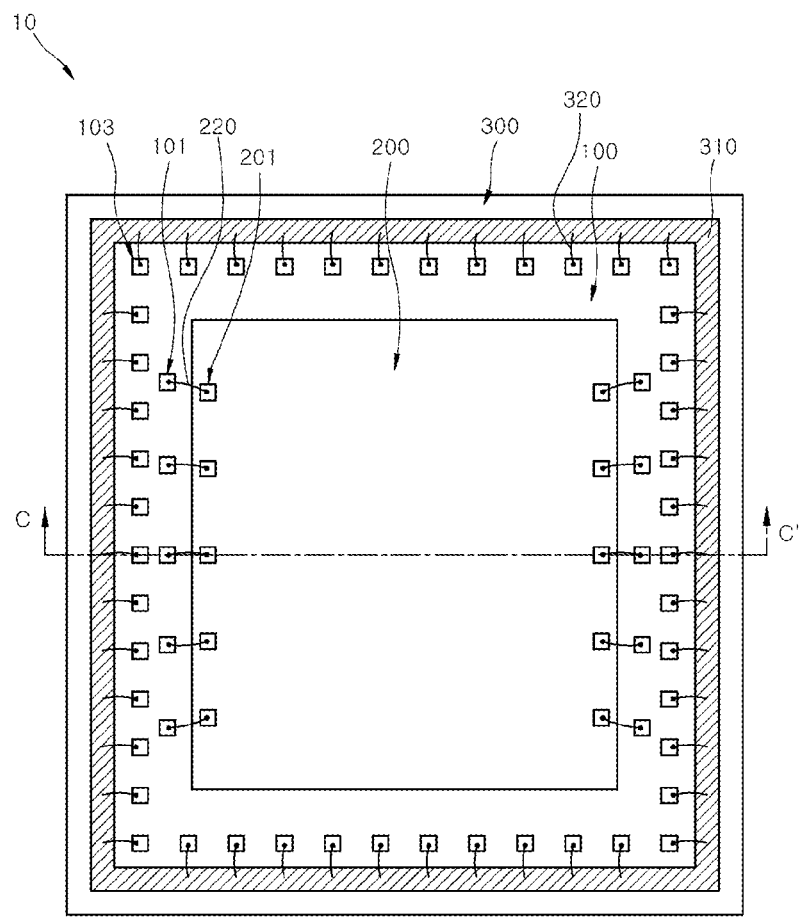
FIGS. 1 to 7 are schematic views illustrating a representation of an example of a semiconductor package according to an embodiment.

The terms used in the description of the embodiments correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong. In the following description of the embodiments, it will be understood that the terms "first" and "second", "top" and "bottom or lower" are intended to identify the member, but not used to define only the member itself or to mean a particular sequence.

The semiconductor package may include electronic devices such as a semiconductor die or chip, and the semiconductor die or chip may include a cut or processed form of a die or chip from a semiconductor substrate in which electronic circuits are integrated. The semiconductor chip may be a memory chip in which memory integrated circuits such as dynamic random access memory (DRAM) devices, static random access memory (SRAM) devices, flash memory devices, magnetic random access memory (MRAM) devices, resistive random access memory (ReRAM) devices, ferroelectric random access memory (FeRAM) devices or phase changeable random access memory (PcRAM) devices. Alternatively, the semiconductor die or chip may be a logic die or an ASIC chip in which logic circuits are integrated on a semiconductor substrate.

The package substrate is a substrate for electrically connecting the semiconductor chip to other devices of the outside, and the package substrate may include circuit traces in a substrate body of a dielectric material layer unlike the semiconductor substrate. The package substrate may have a form of a printed circuit board (PCB). The semiconductor package may be applied to information communication devices such as mobile devices, bio or health care associated electronic devices, and wearable electronic devices to the human body.

The same reference numerals refer to the same elements throughout the specification. Thus, even though a reference numeral is not mentioned or described with reference to a drawing, the reference numeral may be mentioned or described with reference to another drawing. In addition, even though the reference numerals are not illustrated in a drawing, it may be mentioned or described with reference to another drawing.

Figure 2:
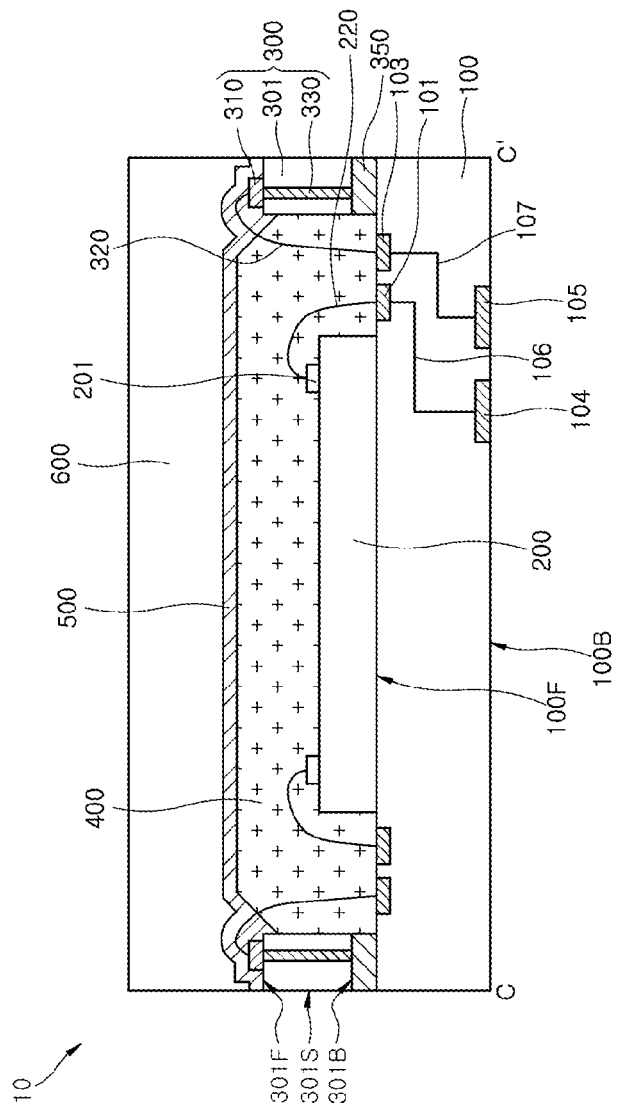

FIGS. 1 and 2 are views illustrating a representation of an example of a semiconductor package according to an embodiment. FIG. 1 is a plan-view illustrating a semiconductor package 10 according to an embodiment and FIG. 2 is a cross-sectional view taken along line C-C' of FIG. 1. FIGS. 3 to 7 illustrate a boundary wall of the semiconductor package.

As illustrated in FIGS. 1 and 2, the semiconductor package 10 includes a package substrate 100 and a semiconductor chip 200 disposed on the package substrate 100. At least one semiconductor chip may be disposed on the package substrate 100, in some cases, a plurality of the semiconductor chips 200 may be disposed on the package substrate 100. The semiconductor chip 200 may include a semiconductor substrate (not illustrated), active devices (not illustrated) such as transistors, and interconnection layers (not illustrated). The active device may be formed on the semiconductor substrate, and the interconnection layer may be formed on the active device and on the semiconductor substrate. The interconnection layer may include an interlayer dielectric (ILD) layer or an inter-metal dielectric (IMD) layer and may be formed on the semiconductor substrate.

The package substrate 100 may include a package interconnection structure for electrically connecting the semiconductor chip 100 including integrated circuit devices to other devices of the outside, unlike the semiconductor substrate on which integrated circuits are integrated. The package substrate 100 may include a dielectric body for electrically isolating the package interconnection structure and may have a shape of a printed circuit board (PCB)

including a package interconnection structure in a printed circuit shape in the dielectric body.

The package substrate 100 has a first connecting pad 101 and a second connecting pad 103 as parts of the package interconnection structure on a first surface 100F. The semiconductor chip 200 and the package substrate 100 may be electrically connected to each other by connecting the first connecting pad 101 to chip pads 201 of the semiconductor chip 200 by a first bonding wire 220. The first connecting pad 101 may be provided as a pad on which the first bonding wire 220 is to be landed. Although the first bonding wire is presented as a connector connecting the semiconductor chip 200 to the package substrate 100, the semiconductor chip 200 may be connected to the package substrate 100 through a bump connecting structure. The second connecting pad 103 may be provided as a ground terminal to which EMI shielding structure 330, 500 provided to the semiconductor package 10 is grounded.

The package substrate 100 may include outer connecting terminals 104, 105 for connecting to outer devices as a part of the package wiring structure on a second surface 100B opposite to the first surface 100F. A first outer connecting terminal 104 may be provided as a ground terminal grounding the EMI shield structure 330, 500 by being connected to the first connecting pad 101 by a first inner wiring layer 106. The first and second inner wiring layers 106, 107 may substantially penetrate the body portion of the package body 100.

A boundary wall 300 is provided on the package substrate 100. As illustrated in FIGS. 1 and 2, the boundary wall 300 may be disposed on a periphery boundary of the package substrate 100. The boundary wall 300, as illustrated in FIG. 2, may be attached to the package substrate 100 by an adhesion layer 350. The adhesion layer 350 may be provided as a member attaching a bottom surface 301B of a wall body 301 of the boundary wall 300 to the package substrate 100 and may have a film shape. An outer side surface 301S of the boundary wall 300 may be exposed as a portion of a side surface of the semiconductor package. The outer side surface 301S of the boundary wall 300 may be arranged to a side surface of the package substrate 100.

Figure 3:
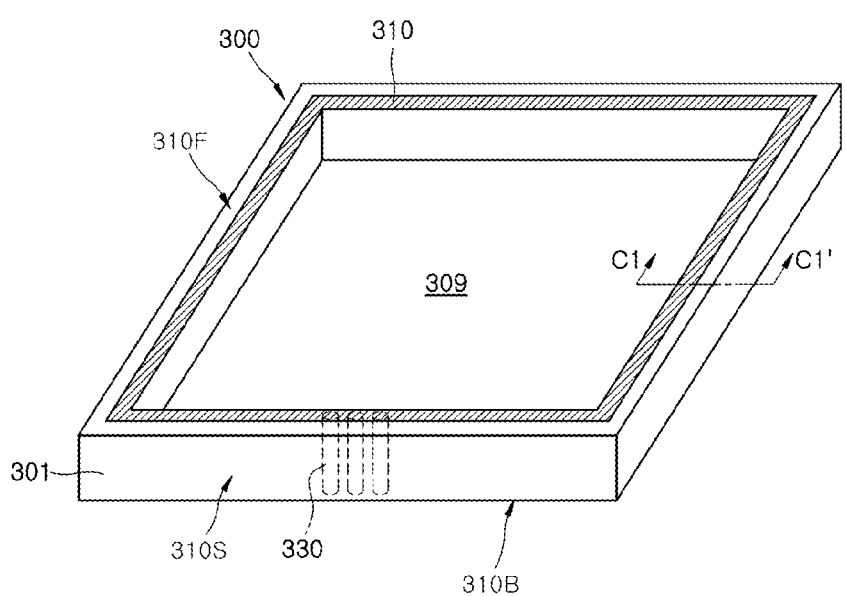
Figure 4:
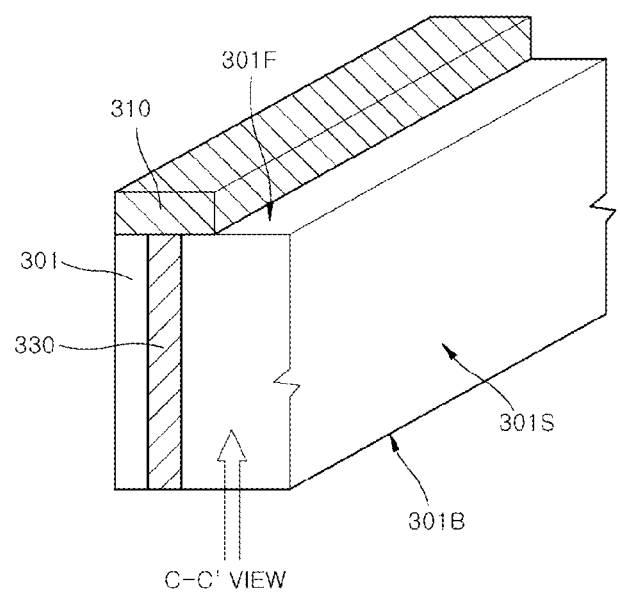

The boundary wall 300, as illustrated in FIGS. 1 and 3, may have a shape of square ring surrounding the semiconductor chip 200. The boundary wall 300 may have a shape of lattice providing a space or an opened window 309 in which the semiconductor chip 200 is to be disposed. The boundary wall 300, as illustrated in FIG. 4, may embed a conductive via portion 330 substantially vertically penetrating the wall body 301. The conductive via portion 330 may provide a lateral EMI shielding structure which shields the EMI in lateral direction with respect to the semiconductor chip 200.

Figure 5:
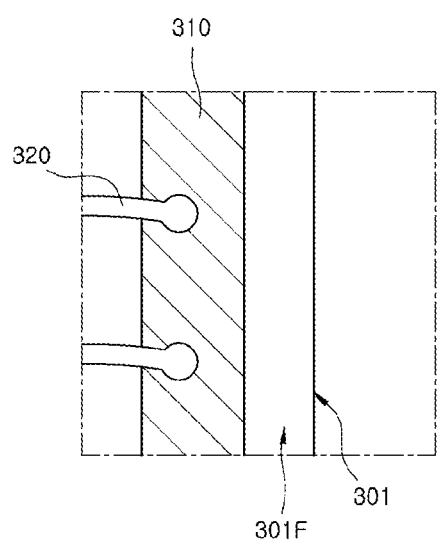

Referring to FIG. 4, a conductive trace 310 may be provided as a conductive layer connected to the conductive via portion 330 on a top surface 301F of the wall body 301. The conductive trace 310 may have a shape of a conductive pattern or a conductive pad electrically connecting the conductive via portion 330 to a conductive roof (500 of FIG. 2). The conductive trace 310, as illustrated in FIGS. 1 and 4, may be located on the top surface 301F of the wall body as a conductive pattern extending along the extension direction of the boundary wall 300. Referring to FIG. 5, a second bonding wire 320 is connected to the conductive trace 310, and the second bonding wire 320 connects the second connecting pad (103 of FIG. 2) to the conductive trace 310. Therefore, a path grounding the conductive via portion may be provided. In this case, a number of the second bonding wires 320 may be connected to the conductive trace 310. The second bonding wire 320 may be presented as a connector that electrically connects the EMI shielding structure including the conductive via portion 330 and the conductive roof 500 to the package substrate 100.

Figure 6:
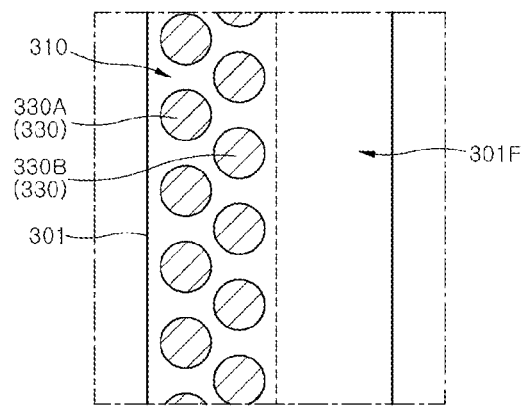
Figure 7:
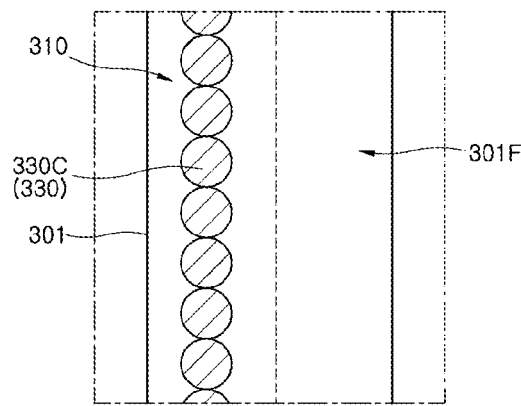

The conductive via portion 330 connected to the conductive trace 310, as illustrated in FIGS. 4 and 6, may be provided as an EMI lateral shielding structure including a number of conductive pillars 330A, 330B (i.e., first conductive pillar 330A, second conductive pillar 330B). The conductive pillars 330A, 330B may include a metal material such as copper (Cu). First conductive pillars 330A are arranged along the extending direction of the wall body 301 and form a first column. When viewed from the direction perpendicular to the outer side surface 301S of the wall body 301, second conductive pillars 330B of a second column may be disposed to cover a potion between the spaced-apart first conductive pillars 330A. The first conductive pillars 330A and the second conductive pillars 330B may be disposed along a zig-zag trajectory. The conductive via portion 330, as illustrated in FIG. 7, may be provided in a structure that side surfaces of conductive pillars 330C (i.e., third conductive pillar 330C) contact and are connected to each other. The structure may be provided along the extending direction of the wall body 301.

Referring to FIGS. 2 and 4, the wall body 301 of the boundary wall 300 may be provided as a member to isolate and to support the embedded conductive via portion 330. The wall body 301 may include a semiconductor substrate, for example, a silicon (Si) substrate. The boundary wall 300 may be formed by forming the conductive via portion 330 to penetrate the silicon (Si) substrate which provides the wall body 301, and by patterning the silicon (Si) substrate to have a ring shape, as illustrated in FIG. 3. The wall body 301 may include a laminate substrate which is used in fabrication a printed circuit board (PCB). The wall body 301 may include a layer of a dielectric material or a block of a dielectric material.

Referring to FIG. 2, the semiconductor package 10 may include a dielectric layer 400 which fills the inner space surrounded by the boundary wall 300 and covers the semiconductor chip 200. The dielectric layer 400 may be included as a member to encapsulate the semiconductor chip 200 and to protect the semiconductor chip 200 from the external environment. The dielectric layer 400 may be provided to fill the inner space of the opened window (309 of FIG. 3) and may be provided in a shape surrounding the boundary wall 300 from side surface. The boundary wall 300 may have a shape of a dam surrounding the dielectric layer 400.

The dielectric layer 400 may be disposed to expose the top surface 301F of the boundary wall 300 and the conductive trace 310. Since the dielectric layer 400 exposes the conductive trace 310 of the boundary wall 300, parts of the second bonding wire 320 secured to the conductive trace 310 may also be exposed to the outside of the dielectric layer 400.

The semiconductor package 10 may include a conductive roof 500 extending to cover a surface of the dielectric layer 400 and to cover the conductive trace 310. The conductive roof 500 may be formed by plating a copper (Cu) layer. The conductive roof 500 covers the surface of the dielectric layer 400 and may act as a member shielding the semiconductor chip 200 embedded in the dielectric layer 400 from the EMI in the upper direction. Since the conductive roof 500 is connected to the conductive trace 310, the conductive roof 500 and the conductive via portion 330 in the boundary wall 300 may form a shielding cage structure shielding the semiconductor chip 200 from the EMI. Since the conductive roof 500 contacts and is secured to the conductive trace 310 and a part of the second bonding wire connected to the conductive trace 310, the conductive roof 500 may be electrically connected to the package substrate 100 through the second bonding wire 320 and grounded.

Referring to FIGS. 1 and 2, a plurality of the second bonding wires 320 may be included to electrically connect the conductive trace 310 to the package substrate 100. The conductive trace 320 may have a ring shape which extends along the boundary wall 300, and the second bonding wires 320 may be closely disposed at the periphery of the semiconductor chip 200 along the boundary wall 300. Since a number of the second bonding wires 320 are disposed, the second connecting pads 103 connected to the second bonding wires 320 may also be disposed in a plurality at the inner side portion of the boundary wall 300 along the boundary wall 300.

The second bonding wires 320 disposed in a plurality may decrease the ground resistance grounding the conductive rood 500 and the conductive via portion 310. The ground resistance is decreased by the second bonding wires 320 disposed in a plurality, the EMI shielding effect by the conductive roof 500 and the conductive via portion 310 can be improved. Since the second bonding wires 320 disposed in a plurality, as illustrated in FIG. 2, are connected to the package substrate 100 while passing the side of the adhesion layer 350 attaching the boundary wall 300 and the package substrate 100, the second bonding wires 320 can act as a member shielding the EMI which may be leaked from the adhesion layer 350. Considerably large numbers of the second bonding wires 320 may be disposed in closely space in order to shield the adhesion layer 350 from the EMI from the side surface.

Referring to FIG. 2, the semiconductor package 10 may include a molding layer 600 covering the conductive roof 500. The molding layer 600 may be formed by a molding process using an epoxy molding compound (EMC). The epoxy molding compound (EMC) may contain a color coating such as carbon for the laser marking. The molding layer 600 may be provided as an encapsulant protecting the semiconductor chip 200.

Figure 8:
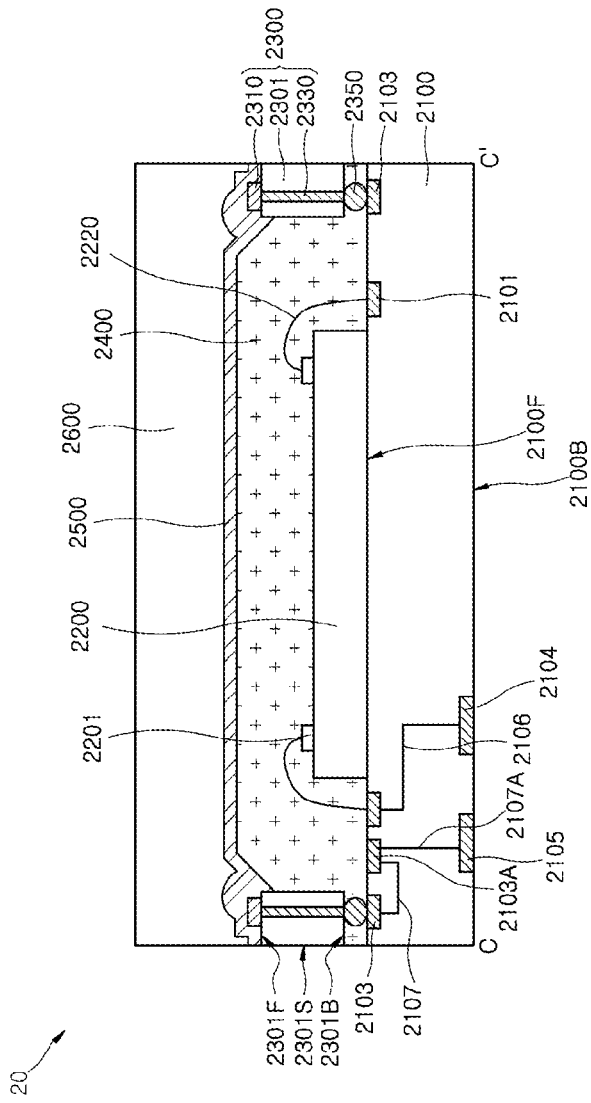
FIG. 8 is a schematic view illustrating a representation of an example of a semiconductor package according to an embodiment.

FIG. 8 illustrates a representation of an example of a semiconductor package 20 according to an embodiment.

Referring to FIG. 8, the semiconductor package may include a package substrate 2100 and a semiconductor chip 2200 disposed on the package substrate 2100. At least one semiconductor chip 2200 may be disposed on the package substrate 2100, in some cases, a plurality of the semiconductor chips 2200 may be disposed on the package substrate 2100. The package substrate 2100 may include first connecting pads 2101 and second connecting pads 2103 on a first surface 2100F on which the semiconductor chip 2200 is disposed as a part of package interconnection structure. The first connecting pads 2101 are connected to chip pads 2201 of the semiconductor chip 2200 by bonding wires 2220. The first connecting pads 2101 may be provided as pads on which the bonding wires 2220 are to be landed. A third connecting pad 2103A may be electrically connected to the second connecting pads 2103. The second connecting pads 2103 and the third connecting pad 2103A may be provided as a ground terminal grounding an EMI shielding structure 2330, 2500 that are included in the semiconductor package 20.

The package substrate 2100 may include outer connecting terminals 2104, 2105 on a second surface 2100B opposite to the first surface 2100F for connecting the package substrate 2100 to the external devices as a part of the package interconnection structure. A first outer connecting terminal 2104 may be connected to the first connecting pads 2101 by a first inner wire 2106, and may be included as a signal terminal applying electrical signals to the semiconductor chip 2200. A second outer connecting terminal 2105 is connected to the third connecting pad 2103A by a second inner wire 2107A, and the third connecting pad 2103A is electrically connected to the second connecting pad 2103 by a third inner wire 2107. The second outer connecting terminal 2105 and the third connecting pad 2103A may be provided as ground terminals grounding the EMI shielding structure 2330, 2500. The first, second and third inner wires 2106, 2107A, 2107 may be provided to substantially penetrate the body portion of the package substrate 2100.

A boundary wall 2300 may be provided on the package substrate 2100. The boundary wall 2300 may be attached to the package substrate 2100 by conductive connecting portions 2350. The conductive connecting portion 2350 may have a solder ball shape or a conductive bump shape. The conductive connecting portion 2350 may be included to secure the second connecting pad 2103 of the package substrate 2100 and surface of end portion of the conductive via portion 2330 exposed to the bottom surface 2301B of the boundary wall 2300. The conductive connecting portion 2350 may be overlapped with the second connecting pad 2103 of the package substrate 2100 and may be overlapped with the conductive via portion 2330 exposed to the bottom surface 2301B of the boundary wall 2300. Outer sides 2301S of the boundary wall 2300 may be exposed as parts forming sides of the semiconductor package 20. The outer side 2301S may be aligned to the side of the package substrate 2100.

The boundary wall 2300 may have a shape of square ring surrounding the semiconductor chip 2200. The boundary wall 2300 may have a shape of a space in which the semiconductor chip 2200 is disposed or a shape of a lattice providing opened windows therein. The boundary wall 2300 may embed conductive via portions 2330 substantially vertically penetrating the wall body 2301. The conductive via portions 2330 may provide a lateral EMI shielding structure which shields the EMI in the lateral direction with respect to the semiconductor chip 2200. The conductive connecting portion 2350 may provide an additional lateral EMI shielding structure which shields the EMI in the lateral direction between the conductive via portions 2330 and the second connecting pad 2103.

Conductive traces 2310 may be provided on the top surface 2301F of the wall body 2301 as conductive layers connected to the conductive via portions 2330. The conductive trace 2310 may have a shape of a conductive pattern or a conductive pad which electrically connect the conductive via 2330 to the conductive roof 2500.

The wall body 2301 of the boundary wall 2300 may be provided as a member to insulate and support the embedded conductive via portions 2330. The semiconductor package 20 may include a dielectric layer 2400 filling the inner space surrounded by the boundary wall 2300 and covering the semiconductor chip 2200. The dielectric layer 2400 may expose the top surface 2301F of the boundary wall 2300 and the conductive traces 2310. The semiconductor package 20 may include a conductive roof 2500 extending to cover a surface of the dielectric layer 2400 and to cover the conductive traces 2310. The semiconductor package 20 may include a molding layer 2600 covering the conductive roof 2500. The conductive roof 2500 may have a shape of an intermediate layer embedded between the molding layer 2600 and the dielectric layer 2400.

FIGS. 9 to 15 illustrate a representation of an example of a method for manufacturing a semiconductor package according to an embodiment.

Figure 9:
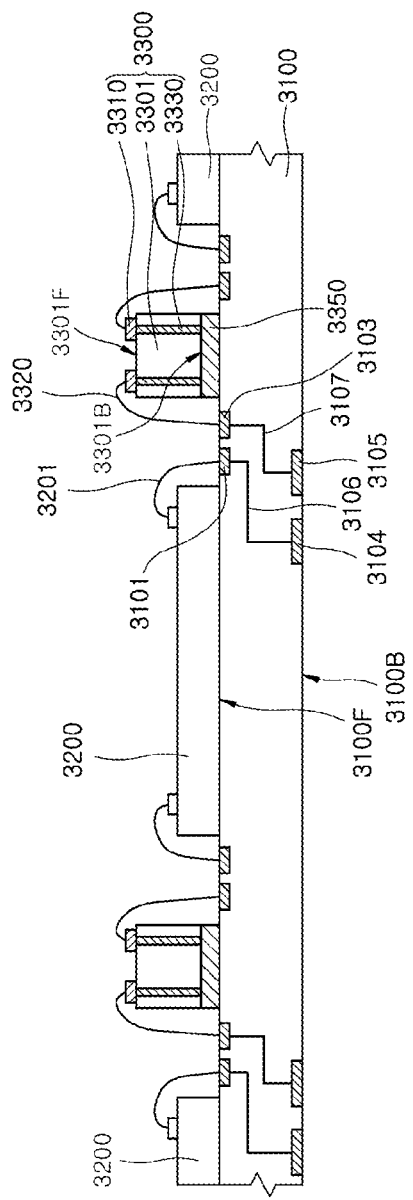
FIGS. 9 to 15 are schematic views illustrating a representation of an example of a method for manufacturing a semiconductor package according to an embodiment.

Referring to FIG. 9, at least one semiconductor chip 3200 is disposed on a package substrate 3100. The semiconductor chip 3200 may be disposed on a first surface 3100F of the package substrate 3100. The package substrate 3100 may include first connecting pads 3101 and second connecting pads 3103 on the first surface 3100F as parts of a package interconnection structure. The package substrate 3100 may include a first outer connecting terminal 3104 and a second outer connecting terminal 3105 on a second surface 3100B opposite to the first surface 3100F as parts of the package interconnection structure. The first outer connecting terminal 3104 may be connected to the first connecting pad 3101 by a first inner wire 3106, and the second outer connecting terminal 3105 may be connected to the second connecting pad 3103 by a second inner wire 3107.

A boundary wall 3300 may be disposed to surround the semiconductor chip 3200. A bottom surface 3301B of the boundary wall 3300 may be attached to the package substrate 3100 using an adhesion layer 3350. First bonding wires 3201 may be formed to connect the first connecting pad 3101 of the package substrate 3100 to a chip pad of the semiconductor chip 3200. A second bonding wire 3320 is formed to connect the conductive trace 3310 disposed on the top surface 3301F of the boundary wall 3300 to the second connecting pad 3103, and conductive via portions 3330 of the boundary wall 3300 is grounded to the package substrate 3100 by the second bonding wire 3320.

Figure 10:
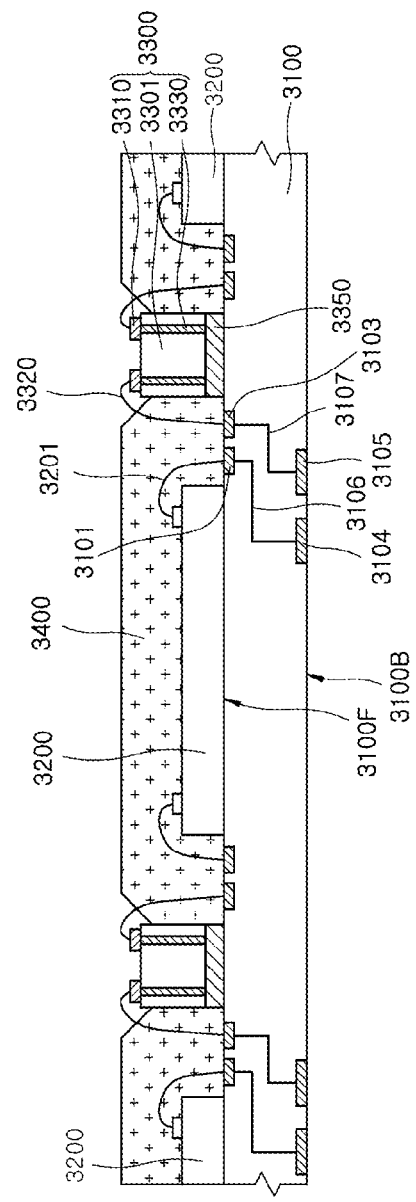

Referring to FIG. 10, a dielectric layer 3400 filling inner space surrounded by the boundary wall 3300 may be formed to cover the semiconductor chip 3200 and to expose the conductive trace 3310. The dielectric layer 3400 may be formed by injecting a dielectric material to fill the inner space surrounded by the boundary wall 3300.

The dielectric material injection process may be performed sequentially so that the dielectric layer 3400 covers each of the semiconductor chips 3200 disposed on the package substrate 3100 in a plurality numbers. When the dielectric layer 3400 is formed by the dielectric material injection, the boundary wall 3300 may act as a dam so that the dielectric material injected in a liquid phase does not overflow the boundary wall 3300 in the lateral direction. The dielectric layer 3400 may be formed to expose the top surface 3301F of the boundary wall 3300.

Figure 11:
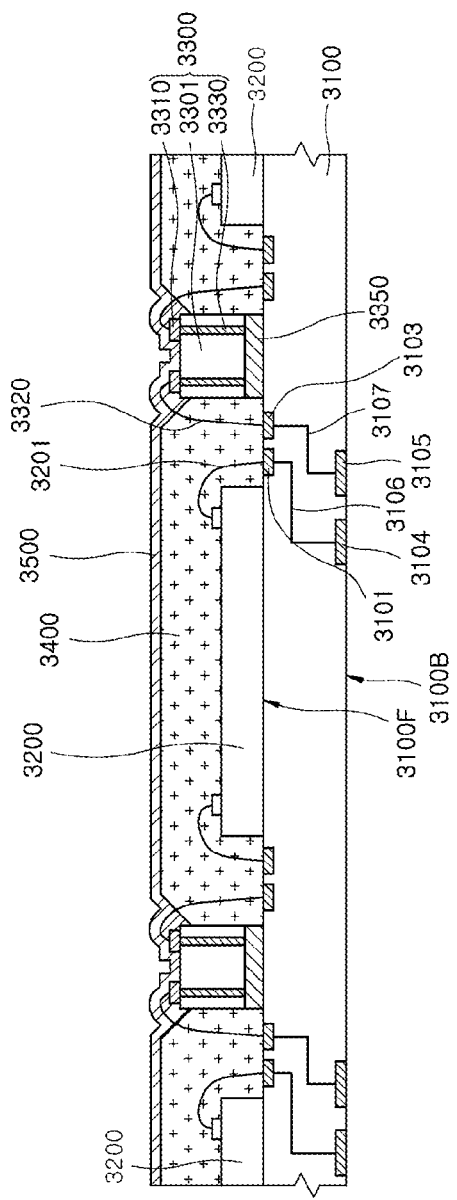

Referring to FIG. 11, the conductive roof 3500 covers surface of the dielectric layer 3400 and the conductive trace 3310 by forming a conductive layer covering a surface of the dielectric layer 3400. The conductive roof 3500 may extend to cover the exposed portion of the second bonding wire 3320 exposed by the dielectric layer 3400. The conductive roof 3500 may include a metal layer such as copper (Cu).

Figure 12:
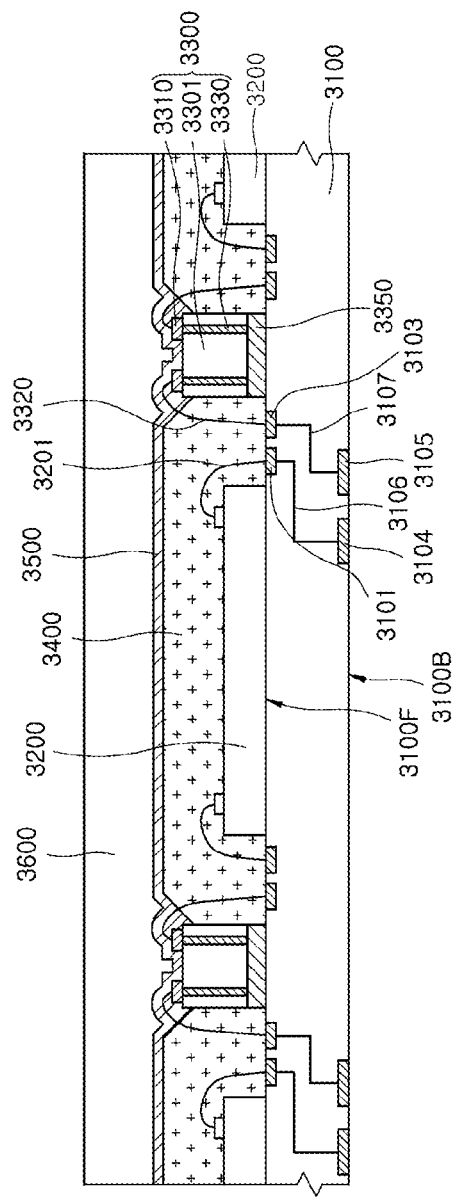

Referring to FIG. 12, a molding layer 3600 covering the conductive roof 3500 may be formed. The molding layer 3600 may be formed using an encapsulant material such as EMC.

Figure 13:
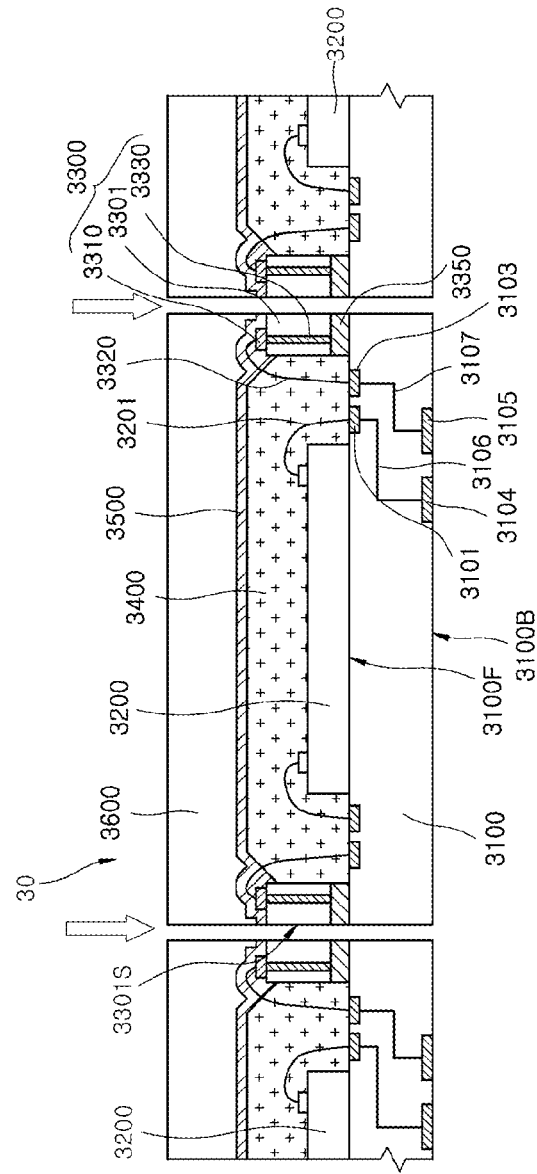

Referring to FIG. 13, a singulation process may be performed so that the central portion of the boundary wall 3300 is divided into both sides by removing a portion of the molding layer 3600, a portion of the boundary wall, and a portion of the package substrate 3100 and dividing the package substrate 3100 into individual package 30. An outer side surface 3301S of the boundary wall 3300 may be exposed from the divided individual semiconductor package 30.

Figure 14:
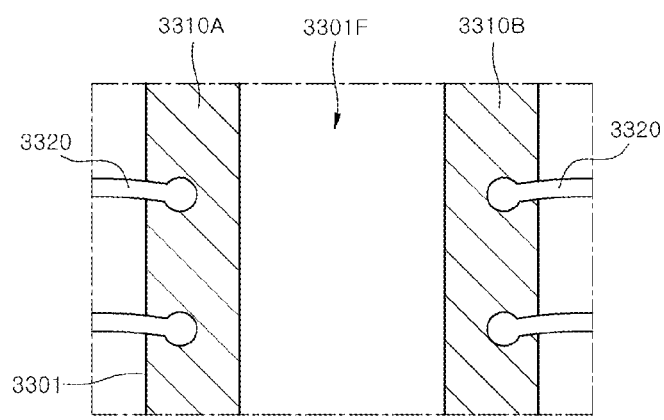
Figure 15:
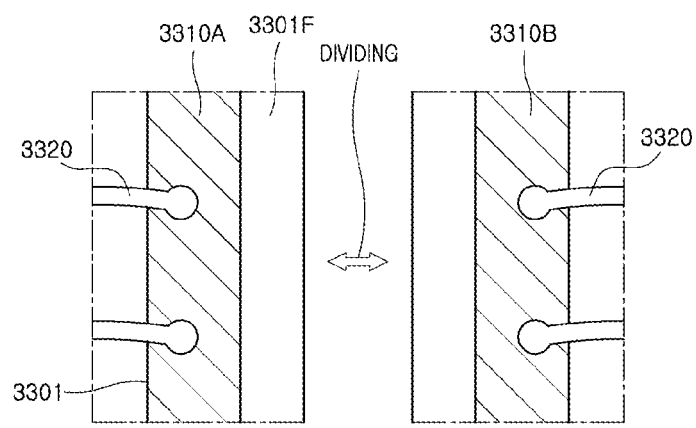

Referring to FIG. 14, a first conductive trace 3310A and a second conductive trace 3310B may be provided as patterns that cover both edges of the top surface 3301F of the wall body 3301 on the initial top surface of the wall body 3301. A portion of the top surface 3301F of the wall body 3301 may be exposed in the central portion between the first conductive trace 3310A and the second conductive trace 33106. A sawing blade (not illustrated) provided in the singulation process may be aligned to the exposed portion of the center of the top surface 3301F of the wall body 3301, and the wall body 3301 may be divided into both sides by removing the exposed using the sawing blade. Since the conductive traces 3310A, 3310B are not located in the portion to be removed in the singulation process, sawing failure that the conductive layer forming the conductive traces 3310A, 33106 are pushed may be prevented.

A method for manufacturing the semiconductor package 30 is described for the case that the conductive traces 3310 and the package substrate 3100 are grounded using the second bonding wire 3320 as an embodiment with reference to FIGS. 9 to 15. However, as illustrated in FIG. 8, the process may be changed to directly secure the conductive via portions (2330 of FIG. 8) and the package substrate (2100 of FIG. 8) using a solder ball or a conductive bump.

Figure 16:
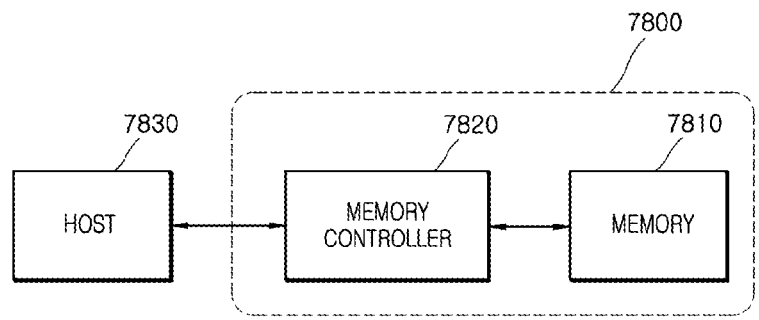
FIG. 16 is a block diagram illustrating a representation of an example of an electronic system employing a memory card including a package in accordance with an embodiment.

FIG. 16 is a block diagram illustrating an electronic system including a memory card 7800 including at least one semiconductor package according to an embodiment. The memory card 7800 includes a memory 7810, such as a nonvolatile memory device, and a memory controller 7820. The memory 7810 and the memory controller 7820 may store data or read stored data. The memory 7810 and/or the memory controller 7820 include one or more semiconductor chips disposed in an embedded package according to an embodiment.

The memory 7810 may include a nonvolatile memory device to which the technology of the embodiments of the present disclosure and embodiments are applied. The memory controller 7820 may control the memory 7810 such that stored data is read out or data is stored in response to a read/write request from a host 7830.

Figure 17:
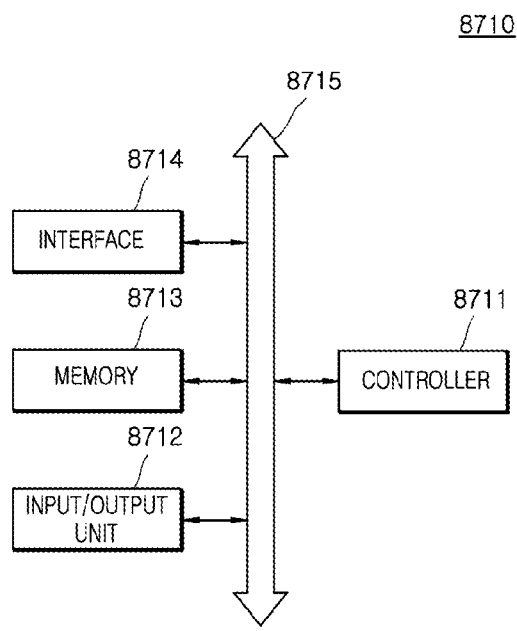
FIG. 17 is a block diagram illustrating a representation of an example of an electronic system including a package according to an embodiment.

FIG. 17 is a block diagram illustrating an electronic system 8710 including at least one package according to an embodiment. The electronic system 8710 may include a controller 8711, an input/output device 8712, and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed above for illustrative purposes. Those skilled in the art will appreciate that various modifications, additions and substitutions are possible, without departing from the scope and spirit of the present disclosure as disclosed in the accompanying claims.

What is claimed is:

1. A semiconductor package, the semiconductor package comprising:
    a package substrate;
    at least one chip disposed on the package substrate;
    a boundary wall including a wall body attached on the package substrate to surround the chip, a conductive via portion substantially vertically penetrating the wall body, and a conductive trace located on the wall body and connected to the conductive via;
    a bonding wire contacting the conductive trace and grounding the conductive via to the package substrate;
    a dielectric layer filling inner space surrounded by the boundary wall and covering the chip, and exposing the conductive trace; and
    a conductive roof covering the conductive trace and extending to cover a surface of the dielectric layer.

2. The semiconductor package of claim 1, further comprising a molding layer covering the conductive roof,
    wherein the conductive roof is embedded between the molding layer and the dielectric layer.

3. The semiconductor package of claim 1, wherein the conductive via extends substantially along the extending direction of the boundary wall inside the wall body.

4. The semiconductor package of claim 1, wherein the conductive via includes a number of conductive pillars substantially vertically penetrating the wall body.

5. The semiconductor package of claim 4,
    wherein the conductive pillars include first conductive pillars configured to form a first column; and
    second pillars configured to form a second column and disposed to cover between the first conductive pillars.

6. The semiconductor package of claim 4, wherein the conductive pillars are disposed having side surfaces of the conductive pillars contact each other, respectively, and are connected to each other.

7. The semiconductor package of claim 1, further comprising an adhesion layer configured to attach the wall body to the package substrate.

8. The semiconductor package of claim 1,
    wherein a portion of the bonding wire is exposed by the dielectric layer, and
    wherein the exposed portion of the bonding wire is surrounded by the conductive roof.

9. The semiconductor package of claim 1, wherein the wall body includes a semiconductor substrate, or a laminated substrate, or layer of a dielectric material.

10. A semiconductor package, the semiconductor package comprising:
    a package substrate;
    at least one chip disposed on the package substrate;
    a boundary wall including a wall body attached to surround the chip on the package substrate, a conductive via portion substantially vertically penetrating the wall body, and a conductive trace disposed on a top surface of the wall body and connected to the conductive via;
    a conductive connecting portion electrically and mechanically connecting the conductive via to the package substrate;
    a dielectric layer filling inner space surrounded by the boundary wall, and covering the chip and exposing the conductive trace; and
    a conductive roof extending to cover the conductive trace and to cover a surface of the dielectric layer.

11. The semiconductor package of claim 10, further comprising a molding layer covering the conductive roof,
    wherein the conductive roof is embedded between the molding layer and the dielectric layer.

12. The semiconductor package of claim 10, wherein the conductive via portion is extended along the extending direction of the boundary wall inside the wall body.

13. The semiconductor package of claim 10, wherein the conductive via portion includes a number of conductive pillars substantially vertically penetrating the wall body.

14. A semiconductor package comprising:
    a package substrate;
    at least one chip disposed on a first surface of the package substrate;
    a boundary wall attached to the package substrate to surround the chip;
    at least one bonding wire coupling the boundary wall to the package substrate; and
    a conductive roof covering a top surface of the boundary wall and extended to cover the first surface of the package substrate and the at least one chip.

15. The semiconductor package of claim 14,
    wherein the boundary wall is attached to the package substrate through an adhesion layer, and
    wherein the at least one bonding wire is configured to shield a side surface of the adhesion layer.

16. The semiconductor package of claim 15, wherein multiple bonding wires are disposed to surround the chip in order to shield a side surface of the adhesion layer from Electro-Magnetic Interference (EMI).

17. The semiconductor package of claim 14, further comprising:
    a conductive trace located on the boundary wall,
    wherein the at least one bonding wire is in contact with the conductive trace to ground the conductive trace to the package substrate.

18. The semiconductor package of claim 17,
    wherein the conductive trace is located on the top surface of a wall body of the boundary wall, and wherein the conductive roof is in contact with the conductive trace.

19. The semiconductor package of claim 17, further comprising:
- a conductive via portion substantially vertically penetrating a wall body of the boundary wall,
- wherein the conductive trace is coupled to the conductive via, and
- wherein the conductive via is grounded by the at least one bonding wire.

20. The semiconductor package of claim 14,
- wherein the at least one bonding wire coupling the boundary wall to the package substrate pass through an inner space formed by the boundary wall.

* * * * *